United States Patent [19]
Yamashita et al.

[11] Patent Number: 5,372,902
[45] Date of Patent: Dec. 13, 1994

[54] METHOD FOR PRODUCING COLOR FILTER

[75] Inventors: Yukio Yamashita, Yokohama; Haruyoshi Sato, Kawasaki; Toru Nakamura, Yokohama; Hitoshi Yuasa, Yokohama; Yutaka Otsuki, Yokohama, all of Japan

[73] Assignee: Nippon Oil Co., Ltd., Tokyo, Japan

[21] Appl. No.: 125,487

[22] Filed: Sep. 22, 1993

[51] Int. Cl.$^5$ .................... G03F 9/00; C25D 13/00
[52] U.S. Cl. ............................. 430/7; 430/20; 430/293; 430/321; 204/181.1; 204/181.6; 204/181.7; 359/900
[58] Field of Search .............. 430/7, 321, 20, 293; 204/181.1, 181.6, 181.7; 359/900

[56] References Cited

U.S. PATENT DOCUMENTS

| | | |
|---|---|---|
| 4,271,246 | 6/1981 | Sato et al. ................. 430/7 |
| 4,902,592 | 2/1990 | Matsumura et al. ........ 430/7 |
| 5,186,801 | 2/1993 | Matsumura et al. ........ 430/7 |
| 5,214,541 | 5/1993 | Yamashita et al. ......... 430/7 |
| 5,214,542 | 5/1993 | Yamashita et al. ......... 430/7 |

Primary Examiner—Charles L. Bowers, Jr.
Assistant Examiner—John S. Chu
Attorney, Agent, or Firm—Darby & Darby

[57] ABSTRACT

A method for producing a color filter involves (A) forming a photosensitive coating film on a transparent electrically conductive layer of a transparent substrate having the transparent electrically conductive layer on its surface, and exposing the photosensitive coating film to light in a first irradiation amount through a mask having a predetermined pattern of a certain light transmittance and at least once displacing the mask to another position on the photosensitive coating film and exposing the photosensitive coating film to light in a second irradiation amount different from the first irradiation amount through the mask; and (B) developing and removing a photosensitive coating film portion exposed to light in one of the smallest and largest irradiation amounts for exposing the transparent electrically conductive layer and electrodepositing a colored coating on the exposed electrically conductive layer for forming a colored layer thereon, operation of developing and removing the photosensitive coating film and electrodepositing the colored coating being sequentially repeated for the respective irradiation amounts where the sequence of repetition is selected from increasing irradiation amount and decreasing irradiation amount to form different colored layers, respectively.

42 Claims, 2 Drawing Sheets

METHOD FOR PRODUCING COLOR FILTER

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, the substrate is immersed in a colored electrodeposition bath for forming a colored layer by electrodeposition and electrical voltage is applied only to a portion of the patterned transparent electrode which is to be dyed in the same color. The substrate is then immersed in a colored electrodeposition bath for forming a different color layer by electrodeposition, and electric voltage is then applied only to a portion of the substrate which is to be dyed in a different color. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazido groups. Besides, if the quinone diazido compound is brought into contact with an aqueous alkali solution, the quinone diazido compound in the unexposed part is also reacted with an aqueous alkali solution so that photosensitivity is markedly changed to present difficulties in the subsequent light exposure and development steps.

SUMMARY OF THE INVENTION

It is an object of the present invention to provide a method for producing a color filter in which high precision fine machining technique is not required, the pattern figure of the colored layer has a high degree of freedom, and the color filter size may be increased easily and in which mass production may be achieved easily and simply.

The above and other objects of the invention will become apparent from the following description.

According to the present invention, there is provided a method for producing a color filter comprising the steps of:

(A) forming a photosensitive coating film on a transparent electrically conductive layer of a transparent substrate having said transparent electrically conductive layer on its surface, and exposing said photosensitive coating film to light in a first irradiation amount through a mask having a predetermined pattern of a certain light transmittance, and at least once displacing said mask to another position on said photosensitive coating film and exposing said photosensitive coating film to light in a second irradiation amount different from said first irradiation amount through said mask; and (B) developing and removing a photosensitive coating film portion exposed to light in one of smallest and largest irradiation amounts for exposing the transparent electrically conductive layer and electrodepositing a colored coating on the exposed electrically conductive layer for forming a colored layer thereon, operation of developing and removing the photosensitive coating film and electrodepositing the colored coating being sequentially repeated for the respective irradiation amounts where said sequence of repetition is selected from the group consisting of increasing irradiation amount and decreasing irradiation amount to form different colored layers, respectively.

PREFERRED EMBODIMENTS OF THE INVENTION

Figure 1:
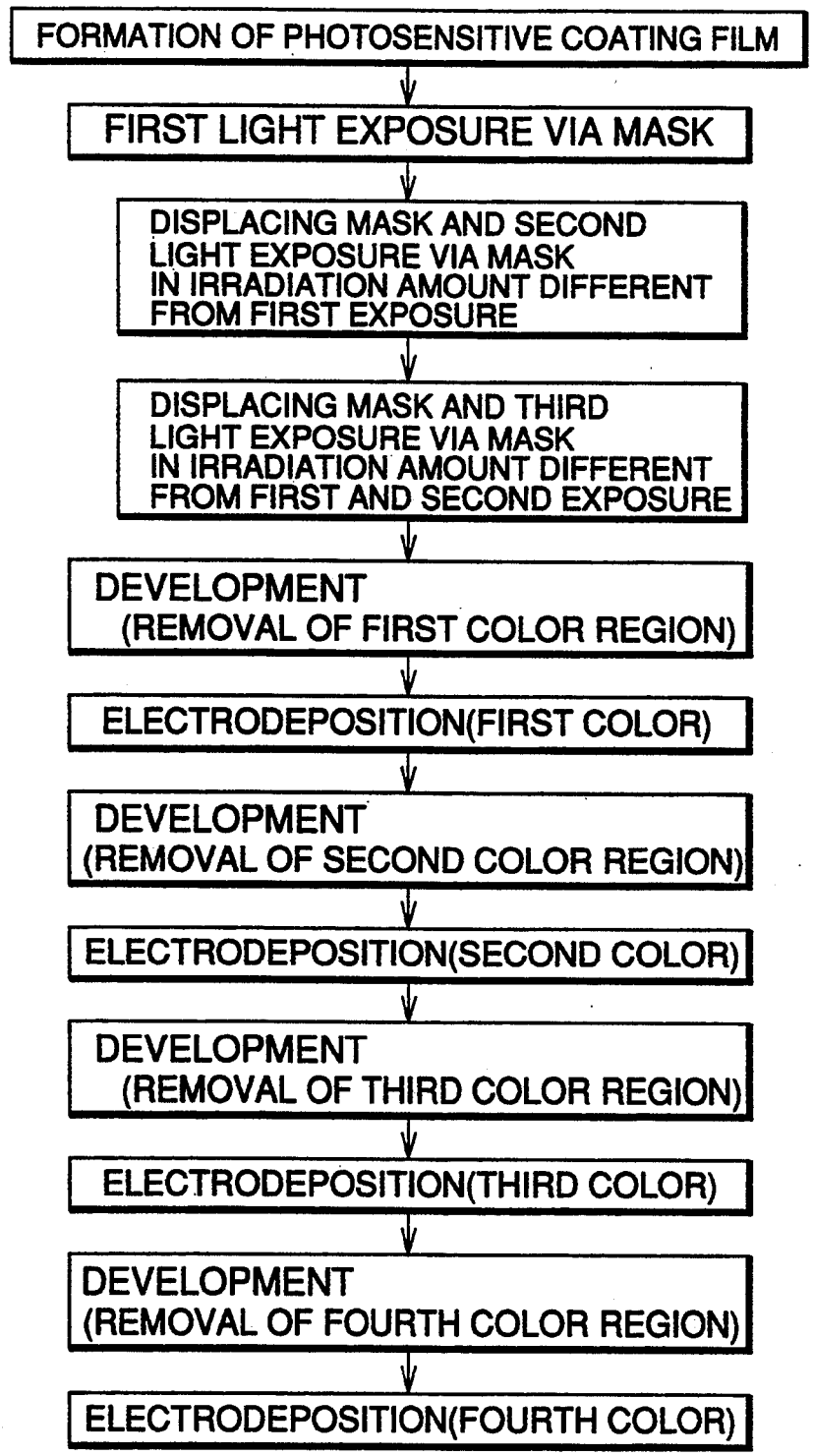
FIG. 1 is a process chart showing an embodiment of the present invention.

In the method for producing a color filter of the present invention, a photosensitive coating film is formed on a transparent electrically conductive layer of a transparent substrate having the transparent electrically conductive layer on its surface and the photosensitive coating film is exposed to light through a mask having a predetermined pattern of a certain light transmittance in a first irradiation amount. Then the mask is at least once displaced to another position, and the photosensitive coating film is exposed to light in a different second irradiation amount. This step is referred to hereinafter as a step A.

There is no particular limitation to the transparent substrate, if the substrate has a transparent electrically conductive layer on its surface. Examples of the substrate may include a glass plate, a laminated plate, a plastic plate, or a plate having an electrically conductive layer formed on the surface of a plate from insulating material. The substrate preferably has a smooth surface in view of the performance desired of a color filter. The surface of the substrate may be ground if so required.

The transparent electrically conductive layer employed in the present invention may be formed of a material mainly composed of tin oxide, indium oxide, antimony oxide or mixtures thereof. There is no particular limitation as to the method of forming the transparent electrically conductive layer and any of the conventional methods, such as spraying, CVD, sputtering or vacuum deposition, may be employed. Commercially available transparent substrates having transparent electrically conductive layers may be employed. The transparent electrically conductive layer may preferably be of the highest degree of transparency as possible in view of the performance required of the color filter.

Although there is no limitation as to the method of forming the photosensitive coating film on the transparent electrically conductive layer of the substrate, it may be formed by application on the transparent electrically conductive layer by any known methods such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator optionally with dyes and/or pigments may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, a nitrogen or sulfur-containing cationic resin or a carboxylic group-containing anionic resin. The negative type photosensitive coating resin may have a molecular weight ranging between 500 and 10,000.

The prepolymer may preferably be formed from epoxy (meth)acrylate, urethane (meth)acrylate, polyester (meth)acrylate, or mixtures thereof.

The nitrogen or sulfur-containing cationic resins may be composed of a main resin, such as acrylic resin, polyester resin, maleinated oil resin, polybutadiene resin, epoxy resin, urethane resin, polyamide resin or mixtures thereof, and the photosensitive groups and nitrogen or sulfur-containing groups, such as amino group, ammonium group, sulfonium group or mixtures thereof, introduced therein. These resins may preferably be neutralized with an acidic substance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzylester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being neutralized with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterificiation reaction followed by being neutralized with basic substances e.g. triethylamine, diethylamine, dimethylethanol amine, ammonia or mixtures thereof, and solubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; and resin compositions containing these resins. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris(acryloyl oxyethyl) isocyanate, and mixtures thereof. The proportion of these (moth) acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive :coating may be any of those known in the art and may be enumerated by benzoins, benzoin ethers, benzylalkyl ketals, benzophenone derivatives, anthraquinone derivatives, thioxanthone derivatives, or mixtures thereof. Sensitizers may be added thereto if so desired. The photopolymerization initiator may be added in an amount of 0.05 to 30 and preferably 0.1 to 30 parts by weight to 100 parts by weight of the negative type photosensitive coating resin. If the amount of the initiator is less than 0.05 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosensitive coating resins may be any of those capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone, isophorone or N-methyl pyrolidone; ethers such as dibutyl ether, dioxane or tetrahydrofuran; alcohols such as methoxy butanol, diacetone alcohol, butanol, octanol or isopropanol; hydrocarbons such as toluene, xylene, cyclohexane or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide or dimethyl sulfoxide, and mixtures thereof.

These organic solvents may be added during solubilization or dispersion in water of the above mentioned cationic or anionic resins for improving bath stability or smoothing coating films.

The hue of the dyes and/or pigments mixed with the positive type or negative type photosensitive coating may be selected freely depending on objects, if so desired. In order to prevent light from leaking, it is preferred to incorporate dark dyes or pigments, particularly black, dark blue, dark purple or dark brown hued dyes or pigments. Two or more dyes and/or pigments may be mixed to obtain desired hue unless their characteristics are impaired.

The dyes and/or the pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 0.3 to 70 wt. % and more preferably 5 to 60 wt. % based on the total photosensitive coating.

Further, the photosensitive coating to be obtained may be rendered light-passing or light-intercepting depending on the kind of dyes and/or pigments and the amount thereof. For example, if 3 to 50% by weight of carbon is present as a pigment relative to the total negative or positive type photosensitive coating, it is possible to obtain a black-hued light-intercepting coating film, which is particularly preferred in order to prevent light from leaking.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 5 $\mu$m and preferably 1 to 3 $\mu$m. The film thickness may be adjusted by controlling, for example electrodeposition conditions, such as voltage, electrodeposition time and bath temperature. However, film thickness adjustment may be usually made under the same conditions as those for electrodeposition coating of colored coatings, as will be explained subsequently. In case there the negative type photosensitive coating film is not used as the colored coating, the film thickness may usually be as thick as approximately 5 to 15 $\mu$m without adding a colorant to reduce hardening prevention action due to oxygen and to prevent formation of pinholes.

For exposing the photosensitive coating film to light, the substrate is exposed to light through a mask having a predetermined pattern of a certain light transmittance. The mask is then displaced at least once and the photosensitive coating film is exposed to light with an irradiation amount different from that prior to the displacement. When displaced twice or more, the irradiation amount at each time should be changed. By displacement herein is meant changing the relative position between the mask and the substrate. Thus the mask may be moved with the substrate remaining stationary or the substrate may be moved with the mask remaining stationary, or both the substrate and the mask may be moved.

Figure 2:
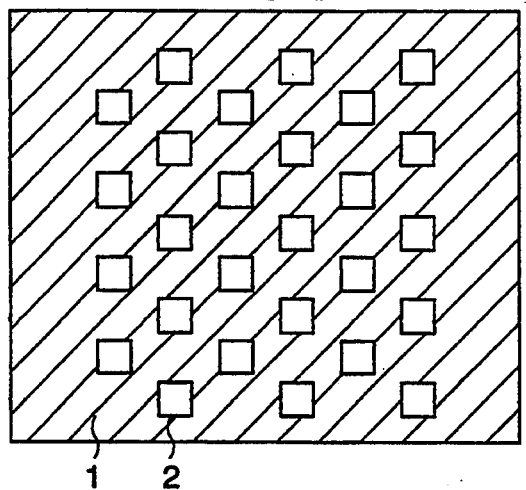
FIG. 2 is an enlarged schematic view showing a mask employed in the Examples of the present invention.
Figure 3:
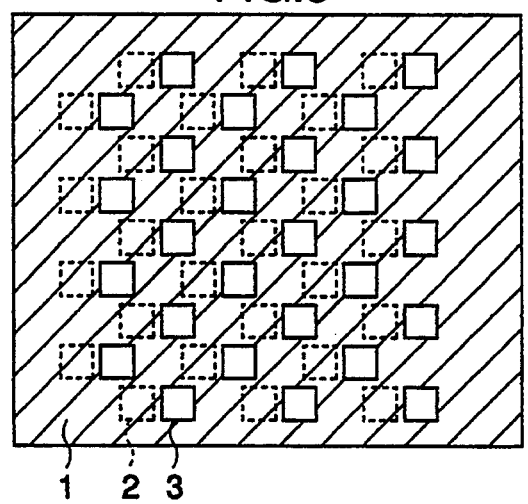
FIG. 3 is an enlarged schematic view employed in Examples of the present invention in which the mask is once displaced laterally.
Figure 4:
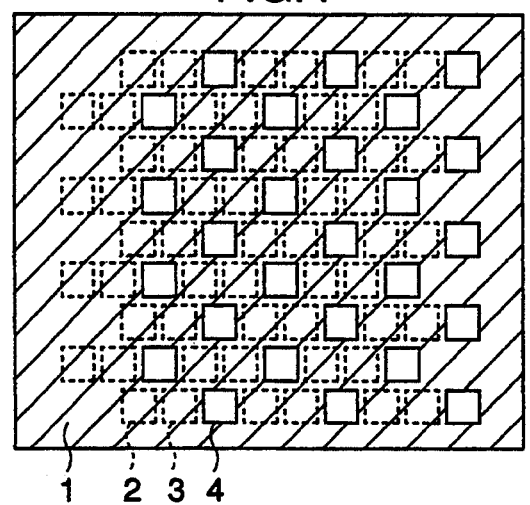
FIG. 4 is an enlarged schematic view employed in Examples of the present invention in which the mask is twice displaced laterally.

The mask having the predetermined pattern employed in the invention may preferably have such portions through which light passes (hereinafter referred to pattern block or blocks) that each pattern block is not overlapped one another after the mask is displaced a required number of times. Thus, the space between one pattern block and the adjacent pattern block should have such a width that after displaced a required number of times, the one pattern block does not overlap with the adjacent pattern block at each light exposure. When forming a light-intercepting portion, the width between pattern blocks forming the light-intercepting portion is equal to [(number of times of displacement+1)×width between pattern blocks]. Explaining the mask further by referring to the drawings, a first light exposure operation is carried out using the mask having the pattern shown in FIG. 2, and the mask is displaced transversely, as shown in FIG. 3, for exposing the portions of the substrate to light, which have not been exposed to light, with an irradiation amount different from that of the preceding light exposure. The mask is then displaced transversely, as shown in FIG. 4, for exposing the substrate with an irradiation amount different from that of the preceding first and second light exposure operations. Since the pattern block are not overlapped during each light exposure operation, the states of light exposure which differ in four stages, inclusive of the portions not exposed to light, are produced.

There is no particular limitation to the directions of the mask displacement which may be the fore-and-aft direction or the transverse direction. The positions and the relative distance of the pattern blocks of the mask may be determined by the number of times, direction or the distance of the mask displacement.

According to the present invention, the mask is displaced at least once and any desired number of times as a function of the number of the colored layers. If the mask is displaced once, three states of light exposure different in three states may be produced inclusive of the portions not exposed to light. Similarly, if the mask is displaced twice or three times, four or five different states of light exposure may be produced, According to the present invention, each light exposure operation is carried out in an irradiation amount different from the irradiation amount(s) used in the preceding light exposure operation(s). There is no particular limitation to means for changing the irradiation amounts and any of the methods of changing the light exposure time, the distance of the light source to the substrate or the output of the light source, may be employed.

The difference in the irradiation amounts used in the light exposure operations may be selected depending on the conditions of light exposure and on the developing conditions as later explained. Since a larger relative difference produced by the light irradiation is preferred because a larger difference in solubility relative to the developing solution is thereby produced, it is preferred to increase the irradiation amount of the largest light irradiation amount to diminish the irradiation amount of the smallest light irradiation. Although there is no particular limitation to the relative difference in the irradiation amounts, it is usually preferred to provide a significant relative difference of not less than 5%.

The above-mentioned light exposure may be performed using an apparatus capable of generating a large amount of ultraviolet rays, such as a high pressure mercury lamp, an ultra high pressure mercury lamp or a metal halide lamp. However, a light radiation source generating a radiation other than UV rays may be employed. The conditions for tight exposure may be suitably selected depending on the negative or positive type photosensitive coatings, the light exposure devices or the above-mentioned masks.

In the method of the present invention, the operation of developing and removing a photosensitive coating film portion exposed to light in one of the smallest and largest irradiation amounts for exposing the transparent electrically conductive layer and electrodepositing a colored coating on the exposed electrically conductive layer for forming a colored layers thereon. The operations of developing and removing the photosensitive coating film and electrodepositing the colored coating are repeated in the sequence of difference in the irradiation amounts to form plural colored layers, respectively (referred to as a step B). If the photosensitive coating film is a negative type photosensitive coating film; the negative type photosensitive film portions on the substrate in register with the pattern blocks with the smallest irradiation amount are selectively developed and removed, and a colored coating is electrodeposited on the exposed electrically conductive layer to form a colored layer. The negative type photosensitive film portions in register with the pattern blocks of the second smallest irradiation amount are then selectively developed and removed, and a different colored layer is electrodeposited on the newly exposed portions of the electrically conductive layer. These operations are repeated in this sequence a desired number of times for producing a desired number of different colored layers.

If the photosensitive coating film is of a positive type, the positive type photosensitive coating film portions in register with the largest irradiation amounts are selectively developed and removed and a colored coating is electrodeposited on:the exposed electrically conductive layer to form a colored layer. The positive type photosensitive coating film portions in register with the second largest irradiation amounts are then selectively developed and removed and a different colored coating is electrodeposited on the newly exposed portions of the electrically conductive layer to form a different colored layer. These operations may be repeated a desired number of times for producing a desired number of different colored layers.

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.05 to 25 wt. %. The developing temperature is usually 10° to 70° C. and preferably 15° to 50° C. and the developing time is usually 2 to 600 seconds and preferably 4 to 300 seconds. As a developing solution in case of employing an anionic resin as a component of the negative type photosensitive coating and in case of employing the positive type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 20 wt. % for development. The development time usually is selected within a range of 2 to 600 and preferably 4 to 300 seconds generally at 10° to 70° C. and preferably 15° to 50° C. As a developing solution in case of employing the positive type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium metasilicate is used as a developing solution, Sodium metasilicate may be used in a concentration range of 0.01 to 25 wt. % and preferably 0.05 to 20 wt. % for development. The development time usually is selected within a range of 2 to 600 and preferably 4 to 300 seconds generally at 10° to 70° C. and preferably 15° to 50° C. For the developing solutions, organic solvents such as alcohols, glycol ethers, ketones, chlorinated hydrocarbons or mixtures thereof, may be employed. Surfactants or defoaming agents may also be added to these developing solutions for improving wattability or anti-foaming properties. Aqueous developing solutions are preferably employed in view of non-toxicity and sanitation in working environments.

In step B, after the development, colored coatings are electrodeposited on the exposed transparent electrically conductive layer for forming a colored layer.

In preparing the colored coating, cationic resins, anionic resins or photocurable resins are used as a film-forming component, and dyes and/or pigments are added as a colorant component, Acidic or basic substances may also be employed for dissolving and/or dispersing these components in water. Organic solvents may be added for facilitating dissolution and/or dispersion of the resins in the colored coating for improving bath stability or for producing smooth coating films.

The cationic resins may for example be resins composed of the main resins used in the photosensitive coating into which nitrogen or sulfur-containing groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol, amine, ammonia or mixtures thereof.

As the photocurable resins, those prepolymers or resins containing acryloyl groups, methacryloyl groups, cinnamoyl groups or mixtures thereof, that are used in the photosensitive coating film in the step A and that are suited for electrodeposition, may be employed. The above mentioned photopolymerization initiators may also be employed in combination.

The colored coatings employed in step B may be different in type, color hue, color concentration or color brightness in the regions exhibiting different light transmittances. Alternatively, the same colored coatings may be used in common for these regions.

The color hue of the colored coating may be selected suitably, depending on particular applications. For example, the photosensitive coating used in step A, the colored coating used in step B and the colored coatings used in step B in case of repeating the electrodepositing process several times, may be those exhibiting different color hues.

The dyes and/or pigments used in the colored coatings may be suitably selected depending on the targeted color hue. It is, however, preferred to use those dyes and/or pigments which are not unsatisfactory in transparency, stability, electrodeposition properties and durability of the coating film. Particularly preferred are those dyes or pigments which may be mixed as the occasion may demand in the above mentioned photosensitive coatings. Two or more of the aforementioned dyes and/or pigments may be mixed depending on the objective color hue as far as the properties of the dyes and/or pigments are not deteriorated.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agents are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 $\mu$m and preferably 1 to 3 $\mu$m.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 1 to 20 minutes and preferably 2 to 10 minutes at a temperature of 120° C. or lower and preferably 30° to 100° C. If the drying temperature is higher than 120° C., the photosensitive coating film is occasionally cured under heat to raise difficulties in the subsequent development process.

According to the present invention, a step of developing and removing a negative type photosensitive coating film or a positive type photosensitive coating film in at least one of plural light-exposed portions with different irradiation amounts to expose an electrically conductive layer, and selectively forming a metal layer thereat, referred to hereinafter as step C, may be carried out, whenever the necessity arises. In addition, a step of electrodepositing a colored coating on the metal layer formed by step C for forming a colored layer with a view to inhibiting the reflection of the metal layer and providing for the same uniform thickness for the metal layer and the colored layer, referred to hereinafter as step D, may also be carried out. Above all, the metal layer may preferably be formed selectively in an interstitial region between the patterns of the colored layers produced in step B. If the photosensitive coating film is formed using a negative type photosensitive coating, it is preferred to carry out the step A, C, D and B in this sequence. If the photosensitive coating film is formed using a positive type photosensitive coating, it is preferred to carry out the steps A, B and C in this order, and to carry out the step D subsequently, if necessary. For improving the clearness of an image which may be obtained by using the color filter, it is preferred to form the metal layer as the light-intercepting layer accurately and, for forming the metal layer accurately, it is preferred to form the metal layer before forming the colored layer. Specifically, if the photosensitive coating film is formed using the negative type photosensitive coating, it is preferred to develop the portion with the least amount of light exposure to form the metal layer before the step B. Although the colored coating is electrodeposited on the metal layer during the step D, it is practically not hindersome. The color hue of the colored layer formed on the metal layer is preferably achieved with the use of a dark-hued colored coating among those that may be used in step B.

The metal layer may preferably be formed by developing and removing the photosensitive coating film remaining on at least one patterned portion and/or on the substrate, before or after formation of the colored layer at step B, and by processing the exposed electrically conductive layer by an electroplating method or an electroless plating method. This processing may be carried out appropriately to conform to the performance required of a color filter with the use of any of a variety of commonly employed plating solutions.

Among metals which may be used as the metal layer, there are a variety of customary metal materials which may be used for plating and which are selected from copper, nickel, silver, and gold, an alloy of two or more of these metals, and metals obtained by mixing two or more of these metals in a plating solution. The thickness of the metal layer may be suitably selected depending on the performance required of the color filter and may be 10 nm to 5 $\mu$m, preferably 10 nm to 3 $\mu$m. The metal layer may preferably be formed so as to be of a thickness equal to that of the colored layer since a planar color filter may thereby be produced.

Since the metal layer is formed, such as by plating, on a selectively exposed portion of the electrically conductive layer, by the above-mentioned step C, the metal layers may be formed in the interstices of the colored layers in a self-aligned manner. Such color filter, capable of improving contrast and color purity, also has the function of an auxiliary electrode line and the function of reducing the heating within the cell or the signal delay otherwise caused on a large display screen.

The desired color filter may be prepared by the above-mentioned steps A, and B and optionally the step C and if necessary the step D. However, if necessary, heating, curing or photocuring may be carried out for further improving weatherability and resistance to chemicals. The heating or curing conditions include the temperature of from 100° to 250° C. and preferably 150° to 250° C. and the operating time of five minutes to one hour and preferably 15 to 40 minutes.

The process according to embodiments of the present invention will be hereinafter explained by referring to FIGS. 1 to 4. It should be noted that the present invention is not limited to this merely illustrative embodiments.

FIG. 1 shows one embodiment of the present process step by step. FIG. 2 shows, in an enlarged schematic view, a mask by which displacement may be performed up to two times with 1 indicating a portion of substantially 0% light-transmittance and 2 indicating pattern blocks through which light-exposure is performed. FIG. 3 is a schematic view of the mask being displaced once laterally with 3 indicating portions to be exposed to light at the second exposure. FIG. 4 is a schematic view of the mask being further laterally displaced from the state shown in FIG. 3 with 4 indicating portions to be exposed to light at the third exposure.

A negative type or positive type photosensitive coating film is formed on the substrate. The substrate is dried and irradiated with light of e.g. 400 mJ, with the interposition of the mask shown in FIG. 2, by way of a first light exposure operation. The mask is then displaced transversly, as shown for example in FIG. 3, and irradiated with the light of e.g. 50 mJ, by way of a second light exposure operation. The mask is then displaced transversely, as shown for example in FIG. 4, and irradiated with the light of e.g. 100 mJ, by way of a third light exposure operation.

A first development operation is then performed, in which the portions irradiated with the smallest amount of light irradiation are developed and removed if the photosensitive coating film is formed using the negative type photosensitive coating, while the portions irradiated with the largest amount of light irradiation are developed and removed if the photosensitive coating film is formed using the positive type photosensitive coating. A colored coating of a first color is electrodeposited or a metal light-intercepting layer is electroplated on the thus exposed electrically conductive layer to form a colored layer or a metal layer. The substrate thus processed is washed with water.

The second development operation is then carried out under conditions different from those used in the first development operation. At this time, the portions with the second smallest irradiated amounts are developed and removed when the photosensitive coating film is formed using the negative type photosensitive coating and portions with the second largest irradiated amounts are developed and removed when the photosensitive coating film is formed using the positive type photosensitive coating. A colored coating of a second color is electrodeposited on the thus exposed electrically conductive layer to form a colored layer. The substrate is then washed with water.

The third development operation is then carried out under conditions different from those used in the first and second development operations. At this time, the portions with the third smallest irradiated amounts are developed and removed if the photosensitive coating film is formed using the negative type photosensitive coating and the portions with the third largest irradiated amounts are developed and removed if the photosensitive coating film is formed using the positive type photosensitive coating. A colored coating of a third color is electrodeposited on the thus exposed electrically conductive layer to form a colored layer. The substrate is then washed with water.

The fourth development operation is then carried out under conditions different from those used in the first to third development operations. At this time, the portions with the largest irradiated amount are developed and removed if the photosensitive coating film is formed using the negative type photosensitive coating, and the portions with the smallest irradiated amounts are developed and removed if the photosensitive coating film is formed using the positive type photosensitive coating. A colored coating of a fourth color is electrodeposited or a metal light-intercepting layer is electroplated on the thus exposed electrically conductive layer to form a colored layer or a metal layer. The substrate is then washed with water to produce the color filter of the invention. After the second and/or third development operation, a metal light-intercepting layer may be formed in place of the colored layer. It is necessary to form at least a colored layer after the first to fourth development operation. A colored layer may be formed on the metal layer.

With the method for producing a color filter of the present invention, the degree of freedom in the pattern shape of the colored layers may be increased without requiring fine processing techniques, while the color filter may also be increased in size. Thus, the color filter may be mass-produced relatively easily. Besides, according to the present invention a color filter having a highly precision light-intercepting layer can be produced.

EXAMPLES OF THE INVENTION

The present invention will be explained hereinbelow with reference to synthesis Examples and Examples which are given only for illustration and are not intended for limiting the invention.

Synthesis Example 1

Synthesis of Cationic Positive Type Photosensitive Resin (X-1)

Synthesis of Unsaturated (x-1)

148 parts of glycidol, 0.8 part of dibutyl tin dilaurylate, 0.2 part of hydroquinone monomethyl ether and 82 parts of 2-ethoxyethyl acetate were charged into a 1 lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxy benzoic acid were added, and the temperature was raised to 110° C. After it was confirmed that the acid value was not more than 5 and the epoxide equivalent weight was not less than 11,000, the reaction was discontinued to produce an unsaturated compound (x-1).

Synthesis of Cationic Positive Type Photosensitive Resin (x-2)

238 parts of diethylene glycol monoethyl ether were charged into a 1 lit separable flask fitted with a thermometer, an agitator, a reflux cooling tube and a dropping funnel, and the temperature was raised to 130° C. Into this mixture, a mixed solution composed of 145 parts of (x-1), 83 parts of isobutyl methacrylate, 167 parts of ethyl acrylate, 78 parts of ethyl methacrylate, 41 parts of dimethylaminoethyl methacrylate and 12 parts of t-butyl peroxy-2-ethyl hexanoate were added dropwise over three hours. After lapse of 30 minutes, a mixed solution of 25 parts of diethylene glycol monoethyl ether and 2 parts of t-butyl peroxy-2-ethyl hexanoate was added dropwise over 30 minutes. The resulting mass was maintained at this temperature for two hours to terminate the reaction. 500 parts of the produced acrylic resin solution were taken into a 3 lit separable flask fitted with a thermometer, an agitator, a reflux cooling tube, a nitrogen inlet pipe and a dropping funnel. Into this mixture 1570 parts of acetone and 60.1 parts of 1,2-naphthoquinone diazido-5-sulfonyl chloride were added, and the resulting mass was agitated thoroughly at room temperature. Into the resulting mixture, 26.7 parts of triethylamine were added dropwise over an hour, and reaction was continued for further two hours. The produced solution was filtered to remove impurities. The resulting mass was added dropwise over about one hour into a 20-fold quantity of well-agitated water and precipitated resins were recovered. After removal of the moisture under reduced pressure, a brownish cationic positive type photosensitive resin (x-2) was produced.

Synthesis of Cationic Positive Type Photosensitive Coating (X-1)

500 g of the cationic positive type photosensitive resin (x-2) were dissolved in 333.3 g of methylethylketone. 11.7 g of acetic acid were added as a neutralizer and the resulting mass was agitated sufficiently and homogenized. As deionized water was added gradually, the resulting mixture was agitated vigorously by a high-speed mixer to effect dispersion in water to prepare an aqueous solution (X-1) of a cationic positive type. photosensitive coating (cationic electrodeposition type).

Synthesis Example 2

Synthesis of Anionic Positive Type Photosensitive Coating (X-2)

Synthesis of Anionic Resin (x-3)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total 5 acid value of 480 mg KOH/g was produced.

Then, 500 g of the maleinated polybutadiene, 218 g of phenoxyethanol and 205 g of diethylene glycol dimethyl ether were charmed into a 2 lit separable flask fitted with a reflux cooling tube, and dissolved homogeneously. Reaction was then carried out under nitrogen at 130° C. for three hours. Then, 61 G of benzylamine were added dropwise for 30 minutes at the same temperature and the temperature was raised to 165° C. Reaction was carried out at this temperature for seven hours to produce a solution of an anionic resin (x-3) containing half ester and imide groups.

Synthesis of Photosensitive Resin (x-4)

1000 g of "NISSEKI POLYBUTADIENE B-1000" (manufactures by NIPPON PETROCHEMICALS CO., LTD.; number average molecular weight, 1,000; iodine value, 430; content of 1,2-linkage, 65%), 388 g of maleic anhydride, 10 g of xylene and 3.0 g of trimethyl hydroquinone were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/g was produced.

Then, 500 g of the maleinated polybutadiene and 300 g of phenoxyethanol were charged into a 2 lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5 lit separable flask fitted with a reflux cooling tube were charged 269 g of 1,2-naphthoquinone azido sulfonyl chloride, 1900 g of dioxane and 300 g of "KYOWARD 1000" manufactured by KYOUWA CHEMICAL INDUSTRY CO., LTD. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (x-4).

The produced resin (x-4) in solution contained 150 mg equivalent of naphthoquinone diazido groups per 100 g of resin, and the non-volatile content amounted to 60.0 wt. %.

Synthesis of Anionic Positive Type Photosensitive Resin (x-5)

750 g of the (x-3) resin solution and 670 g of the (x-4) photosensitive resin were mixed thoroughly followed by adding 60 g of triethylamine for sufficiently neutralization to produce an anionic positive type photosensitive resin (x-5) in solution.

Synthesis of Anionic Positive Type Photosensitive Coating (X-2)

Deionized water was added gradually to 500 g of a solution of an anionic positive type photosensitive resin (x-5) and the resulting mixture was agitated vigorously with a high-speed mixer to effect dispersion in water for preparing an aqueous solution of an anionic positive type photosensitive coating (X-2) of an anionic electrodeposition type.

Synthesis Example 3

Synthesis of Cationic Negative Photosensitive Coating (x-3)

Synthesis of Amine-added Expoxidated Polybutadiene (x-6)

1,000 g of epoxidated liquid polybutadiene, manufactured by NIPPON PETROCHEMICALS CO., LTD. under the trade name of "E-1000-8", with a number average molecular weight of 1,000 and an oxirane oxygen content of 8%, were charged into a 2 lit separable flask, fitted with a thermometer, stirrer and a reflux cooling pipe. After replacing the atmosphere within the system by nitrogen, 231.2 g of methylethanol amine were added and reaction was carried out at 170° C. for five hours. Non-reacted methylethanol amine was then distilled off under reduced pressure to produce amine-added epoxidated polybutadiene (x-6) with an amine value of 230.4 mmol/100 g.

Synthesis of Unsaturated Group-Containing Isocyanate Compound (x-7)

435.5 g of 2,4-tolylene diisocyanate and 266.1 g of diethylene glycol dimethyl ether were charged into a 2 lit round-bottom flask, which might be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (x-7).

Synthesis of Cationic Resin (x-8)

500 g of (x-6) were dissolved in 166.7 g of diethylene glycol dimethyl ether in a 2 lit separable flask. 713.4 g of (x-7), in which isocyanate groups were contained in an amount of 0.8 equivalent to 1 equivalent of hydroxyl groups in (x-6), were added dropwise at 40° C., at which temperature the reaction was carried out for one hour. The IR absorption spectral analyses indicated that the isocyanate groups had disappeared. A cationic resin (x-8), in which (x-7) was added to (x-6), was produced.

Synthesis of Cationic Negative Type Photosensitive Coating (X-3)

To 500 g of the cationic resin (x-8) were added 27.0 g of "IRGACURE 907" manufactured by CIBA GEIGY INC. and 3.0 g of "KAYACURE DETX" manufactured by NIPPON KAYAKU CO. LTD., as photopolymerization initiators, under agitation, and 16.7 g of acetic acid were added to the resulting mass as a neutralizer. The resulting mixture was agitated thoroughly and re-homogenization. Deionized water was added gradually to the homogenized mass and the resulting mixture was agitated vigorously by a high-speed mixer to effect dispersion in water to prepare an aqueous solution of the cationic negative type photosensitive coating (X-3) of the cationic electrodeposition type.

Synthesis Example 4

Synthesis of Anionic Negative Type Photosensitive Coating (X-4)

Synthesis of Half-Esterified Product (x-9) solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone were charged into a 3 lit separable flask, fitted with a thermometer, a stirrer, a reflux cooling pipe and a nitrogen blowing tube, and reaction was carried out under nitrogen at 190° C. for five hours. After nonreacted maleic anhydride and xylene were distilled off, maleinated polybutadiene with a total acid value of 400 mg KOH/g was produced.

Then, 400 g of the maleinated polybutadiene and 188.5 g of diethylene glycol dimethyl ether and 0.4 g of hydroquinone were charged into a 2 lit flask fitted with a reflux cooling tube and the temperature was raised to 80° C. After the mixture was dissolved uniformly, 165.6 g of 2-hydroxyethyl acrylate and 20 g of triethylamine were added and reaction was carried out at 80° C. for two hours to produce a half-esterified product (x-9) in solution. The total acid value of the produced half-esterified product (x-9) in solution was 105 mg KOH/g and the non-voltile content amounted to 75.0 wt. %.

Synthesis of Anionic Negative Type Photosensitive Coating (X-4)

To 500 g of the produced solution of the half ester (x-9) were added 27.0 g of "IRGACURE 907" manufactured by CIBA GEIGY INC. and 3.0 g of "KAYA-CURE DETX", manufactured by NIPPON KAYAKU CO., LTD., as photopolymerization initiators. To the resulting mass were added 33.7 g of triethylamine as a neutralizer and the resulting mass was agitated thoroughly and re-homogenized. Deionized water was added gradually to the resulting mass and the resulting mixture was agitated vigorously with a high-speed mixture to effect dispersion in water to prepare an aqueous solution of an anionic negative type photosensitive coating (X-4) of the anionic electrodeposition type.

Synthesis Example 5

Synthesis of Solution of Half-Ester (X-5)

1,000 g of "NISSEKI POLYBUTADIENE-1000", a trade name of a product by NIPPON PETROCHEMICALS CO., LTD. with a number average molecular weight of 1,000, an iodine value of 430 and 1,2 -linkages of 65 percent, 554 g of maleic anhydride, 10 g of xylene and 3.0 g of trimethyl hydroquinone, were charged into a separable flask of a 3 lit. capacity, fitted with a thermometer, an agitator, a reflux cooler and a nitrogen blowing tube, and reacted at 190° C. for five hours under a nitrogen stream. Non-reacted maleic anhydride and xylene were distilled off to produce maleinated polybutadiene with a total acid value of 400 mg KOH/g.

1,000 g of the aforementioned maleinated polybutadiene, 461.8 g of diethylene glycol dimethyl ether, 3.0 g of N,N-dimethyl benzylamine and 385.5 g of benzyl alcohol, were charged into a separable flask of a 3 lit. capacity fitted with a reflux cooling tube, and dissolved uniformly. The resulting mass was reacted at 120° C. for two hours under a nitrogen stream to produce a solution of a half-ester (X-5). The total acid value of the produced half ester (X-5) in solution was 109.3 mg KOH/g and the non-volatile content accounted for 75.0 wt. %.

Synthesis Example 6

Preparation of Colored Coatings (Y-1, Y-2 and Y-3)

A solution of the cat ionic resin (x-8), the photopolymerization initiator, and pigment were mixed under agitation and dispersed by a laboratory type three-roll roll mill produced by KODAIRA SEISAKUSHO KK until the pigment reached a particle size of 0.2 μm or less. The particle size was measured using a COULTER counter N4 produced by COULTER INC. To each resulting dispersion mixture was added acetic acid as a neutralizer and each of the mixtures was agitated thoroughly for re-homogenization. Each of the resulting masses was despersed in water under gradual addition of deionized water and under agitation vigorously with high-speed mixer, to produce each colored coating (Y-1, Y-2 and Y-3) having a solid concentration of 10 wt %. The compositions of the aqueous solutions of the three-color colored coatings (cationic electrodeposition type) are shown in Table 1, where the numerical figures denote parts by weight.

TABLE 1

| Coating Color | Y-1 Red | Y-2 Green | Y-3 Blue |
|---|---|---|---|
| Cationic resin (x-8) solution | 213.3 | 213.3 | 213.3 |
| IRGACURE 907 (*) | 11.5 | 11.5 | 11.5 |
| KAYACURE DETX (**) | 1.3 | 1.3 | 1.3 |
| Acetic acid (Neutralizer) | 19.8 | 19.8 | 19.8 |
| Phthalocyanine Blue (***) | — | — | 20 |
| Photoalocyanine Green (****) | — | 20 | — |

TABLE 1-continued

| Coating Color | Y-1 Red | Y-2 Green | Y-3 Blue |
|---|---|---|---|
| Azo Metal Salt Red Pigment (*****) | 20 | — | — |

(*) "IRGACURE 907" mfd. by CIBA GEIGY INC.
(**) "KAYACURE DETX" mfd. by NIPPON KAYAKU CO., LTD.
(***) Phthalocyanine Blue "SR-150C" (mfd. by SANYO SHIKISO KK)
(****) Phthocyanine Green "SAX" (mfd. by SANYO SHIKISO KK)
(*****) "PIGMENT RED 4BS" (mfd. by SANYO SHIKISO KK)

Synthesis Example 7

Preparation of Colored Coatings (Y-4, Y-5 and Y-6)

The solution of the half-ester (X-5) and pigment were mixed under agitation and dispersed by a laboratory type three-roll roll mill, manufactured by KODAIRA SEISAKUSHO KK, until the pigment particle size of 0.2 μm or less was reached. The particle size was measured using a COULTER counter N4 manufactured by COULTER INC. To each resulting dispersion mixture was added triethylamine as a neutralizer and the resulting mixture was agitated sufficiently and re-homogenized. Deionized water was added gradually and each resulting mass was agitated vigorously by a high-speed mixer to effect dispersion in water to prepare each of colored coatings (Y-4, Y-5 and Y-6) having a solid concentrations of 10 wt %. The compositions of the aqueous solutions of the three-color colored coatings of the anionic electrodeposition type are shown in Table 2. The numerical values in Table 2 represent parts by weight.

TABLE 2

| Coating Color | Y-4 Red | Y-5 Green | Y-6 Blue |
|---|---|---|---|
| Half Ester (X-5) solution | 213.3 | 213.3 | 213.3 |
| Triethylamine (Neutralizer) | 21.0 | 21.0 | 21.0 |
| Phthalocyanine Blue (*) | — | — | 20 |
| Photoalocyanine Green (**) | — | 20 | — |
| Azo Metal Salt Red Pigment (***) | 20 | — | — |

(*) "SR-150C" manufactured by SANYO SHIKISO KK
(**) "SAX" manufactured by SANYO SHIKISO KK
(***) "PIGMENT RED 4BS" manufactured by SANYO SHIKISO KK Synthesis Example 8

Preparation of Black-Hued Coating (Y-7)

To 500 g of a solution of the cationic resin (x-8) were added as photopolymerization initiators 27.0 g of "IRGACURE 907" produced by CIBA GEIGY INC., 3.0 g of "KAYACURE DETX" produced by NIPPON KAYAKU CO., LTD., and 37.5 g of "CARBON BLACK #5B", produced by MITSUBISHI KASEI CORPORATION, under agitation and the resulting mass was dispersed by a laboratory three-roll roll mill produced by KODAIRA SEISAKUSHO KK, until the carbon black reached a particle size of 0.2 μm or less. The particle size was measured using a COULTER counter N4 produced by a COULTER INC. To the resulting dispersion mixture were added 16.7 g of acetic acid as a neutralizer and agitated thoroughly for re-homogenization. The resulting mass was dispersed in water under gradual addition of dionized water and agitated vigorously by a high-speed mixer to produce a colored coating (Y-7) having a solid concentration of 15 wt. %.

Synthesis Example 9

Preparation of Colored Coating (Y-8)

To 500 g of a solution of the half ester (x-9) were added, under agitation, as photopolymerization initiators 27.0 g of "IRGACURE 907" produced by CIBA GEIGY INC., 3.0 g of "KAYACURE DETX" produced by NIPPON KAYAKU CO., LTD., and 37.5 g of "CARBON BLACK #5B" for mixing and the resulting mixture was dispersed by a laboratory three-roll roll mill, produced by KODAIRA SEISAKUSHO KK until the carbon black reached the particle size of 0.2 $\mu$m or less. The particle size was measured using a COULTER counter N4 produced by a COULTER INC. To the resulting dispersion mixture were added 33.7 g of triethylamine as a neutralizer and agitated thoroughly for re-homogenization. The resulting mass was agitated vigorously by a high-speed mixer under gradual addition of deionized water for dispersion in water to produce a colored coating (Y-8) having a solid concentration of 15 wt. %.

EXAMPLE 1

With the use, as a cathode, of a pyrex glass substrate, 1.1 mm in thickness, having an indium-tin oxide (ITO) film, 80 nm in thickness, on its surface, referred to hereinafter as a master plate 1, and with the use, as an anode, of a stainless steel beaker, containing an aqueous solution of a cationic positive type photosensitive coating (X-1), electrodeposition was carried out for 60 seconds with a dc voltage of 40 V and a temperature of 25° C. After washing the master plate 1 with ion-exchanged water, the master plate 1 was dried at 80° C. for five minutes and cooled to form a non-tacky black uniform coating with a film thickness of 2 $\mu$m.

A mask shown in FIG. 2 was intimately contacted with the coating film and irradiated with UV rays of 500 mJ/cm$^2$ using a UV exposure device having a high pressure mercury lamp, manufactured by ORC MANUFACTURING CO., LTD. under trade name of JL-3300. The mask was then displaced on the coating film transversely to a position shown in FIG. 3 and intimately contacted with the coating film. The mask was then irradiated with UV rays of 50 mJ/cm$^2$. The mask was further displaced on the coating film to a position shown in FIG. 4 and intimately contacted with the coating film followed by irradiation with UV rays of 100 mJ/cm$^2$.

On development with a 0.3 wt. % aqueous solution of sodium metasilicate, only the portions of the cationic positive type photosensitive;coating film irradiated with the largest irradiation amounts were selectively removed to expose the ITO layer. After washing with water and drying, electrodeposition was carried out by applying a d.c. voltage of 25 V was applied at 25° C. for three minutes across the master plate 1 as an anode and a stainless steel beaker containing a colored coating Y-4 as a cathode. After washing the master plate 1 with ion-exchanged water, following by drying at 80° C. for five minutes, a red-hued colored layer 2, 2 $\mu$m in thickness, which was not tacky at ambient temperature, was produced on the master plate portions freed of the coating film.

After development with a 1.3 wt. % aqueous solution of sodium metasilicate, no changes were noticed in the red-hued colored layers, while only the positive type photosensitive coating film in register with the portions irradiated with the second largest irradiation amounts were selectively removed. After washing with water and drying, the colored coating Y-5 was electrodeposited for three minutes under conditions of a d.c. voltage of 25 V and a temperature of 25° C., in the same manner as when electrodepositing the colored coating Y-4, and the resulting substrate was washed with ion-exchanged water. It was found that there were no changes in the previously formed red-hued colored layer, and a green-hued colored layer 4 was formed on the master plate portions freed of the coating film. After drying at 80° C. for five minutes and development with a 3.0 wt. % aqueous solution of sodium metasilicate, it was found that no changes were produced in the red-hued or green-hued colored layers, and only the positive type photosensitive coating film portions in register with the portions irradiated with the third largest irradiation amount were selectively removed. After washing with water and drying, a colored coating Y-6 was electrodeposited for three minutes in the same manner as for electrodepositing the colored coating Y-4, under conditions of a d.c. voltage of 25 V and a temperature of 25° C. After washing the master plate 1 with ion-exchanged water, it was found that no changes were produced in the previously formed red-hued or green-hued colored layers, and a blue-hued colored layer 3 was formed on the master plate portions freed of the coating film. After further drying at 80° C. for five minutes and development with a 5.0 wt. % aqueous solution of sodium hydroxide, it was found that no changes were produced in the colored layers, and the residual cationic positive type photosensitive coating, that is the photosensitive coating film portions in register with the portions irradiated with the smallest irradiation amount, were selectively removed. Electroplating was carried out for three minutes, at a current density of 0.1 A/cm$^2$, in a nickel plating bath of 45° C., using the exposed ITO layer as a cathode. After washing with water and drying, a master plate 1 having a non-transmitting or light-intercepting nickel plated layer 1 and the colored layers was produced. For completing curing, the master plate 1 was baked at 170° C. for 30 minutes to produce a color filter having the colored layers excellent in transparency and the light-intercepting nickel layer, each having a film thickness of 1.9 $\mu$m.

EXAMPLE 2

With the use as an anode of a similar substrate as used in Example 1 (hereinafter referred to "master plate 2") and with the use as a cathode of a stainless steel beaker containing an aqueous solution of an anionic positive type photosensitive coating (X-2), electrodeposition was carried out for two minutes at a d.c. voltage of 45 V and a temperature of 25° C. After washing the master plate 2 with ion-exchanged water, followed by drying at 80° C. for five minutes, a uniform non-tacky black coating film, having a film thickness of 2 $\mu$m, was produced.

A mask shown in FIG. 2 was intimately contacted with the coating film and irradiated with UV rays of 500 mJ/cm$^2$ with the use of a UV exposure device manufactured by ORC MANUFACTURING CO., LTD. under the trade name of JL-3300. The mask was then transversly displaced on the coating film to a position shown in FIG. 3 and irradiated with UV rays of 50 mJ/cm$^2$ as the mask was intimately contacted with the coating film. The mask was further displaced on the coating film to a position shown in FIG. 4, and irradiation of UV rays of 100 mJ/cm$^2$ while being intimately contacted with the coating film.

After development with a 0.5 wt. % aqueous solution of sodium metasilicate, only the anionic positive type photosensitive coating film portions in register with the portions irradiated with the largest irradiation amount were selectively removed to expose the electrically conductive layer. After washing with water and drying, electrodeposition was carried out by applying a d.c. voltage of 25 V at 30° C. for three minutes across the master plate 2 as a cathode and a stainless steel beaker containing the colored coating Y-1 as an anode. After washing the master plate 2 with ion-exchanged water and drying at 80° for five minutes, a red-hued colored layer 2, 2 μm film thickness, which was not tacky at ambient temperature, was formed on the master plate portions freed of the coating film.

Then, after development with a 1.5 wt. % aqueous solution of sodium metasilicate, it was found that no changes were produced in the red-hued colored layer 2, while only the positive type photosensitive coating film portions in register with the portions irradiated with the second largest irradiation amounts were selectively removed. After washing with water and drying, a colored coating Y-2 was electrodeposited for three minutes under conditions of the d.c. voltage of 30 V and a temperature of 25° C., in the same manner as for electrodeposition of the colored coating Y-1. After subsequent washing with ion-exchanged water, it was found that no changes Were produced in the previously formed red-hued colored layer 2, and a green-hued colored layer 4 was formed on the master plate portions freed of the coating film. After drying at 80° C. for five minutes and development with a 4.0 wt. % aqueous solution of sodium metasilicate, it was found that no changes were produced in the red-hued and green-hued colored layers and only the positive type photosensitive coating film portions in register with the portions irradiated with the third largest irradiation amount were selectively removed. After washing with water and drying, the colored coating Y-3 was electrodeposited for three minutes at a d.c. voltage of 30 V and a temperature of 25° C. in the same manner as for electrodepositing the colored coating Y-1. After washing the master plate 2 with ion-exchanged water, is was found that no changes were produced in the previously formed red-hued or green-hued colored layers, and a blue-hued colored layer 3 was produced on the master plate portions freed of the coating film.

Then, after drying at 80° C. for five minutes and development with a 7.0 wt. % aqueous solution of sodium metasilicate, it was found that no changes were produced in the colored layers, and only the residual cationic positive type photosensitive coating film, that is the photosensitive coating film portions in register with the portions irradiated with the smallest irradiation amount, were selectively removed. The colored coating Y-7 was electrodeposited for three minutes under conditions of a d.c. voltage of 30 V and a temperature of 25° C. similarly to electrodeposition of the colored coating Y-1. After washing with ion-exchanged water, followed by drying at 80° C. for five minutes and subsequently cooling, the master plate 2 having red-hued, green-hued, blue-hued, and black-hued colored layers was produced.

After baking at 170° C. for 30 minutes to complete curing, a color filter having transparent and homogeneous colored layers as well as black light-intercepting layer, each having film thickness of 1.9 μm was produced.

EXAMPLE 3

With the use as a cathode of a similar substrate as used in Example 1, referred to hereinafter as a master plate 3, and with the use as an anode of a stainless steel beaker containing an aqueous solution of a cationic negative type photosensitive coating (X-3), electrodeposition was carried out for 3 minutes at a d.c. voltage of 30 V and a temperature of 25° C. After Washing the master plate 3 with ion-exchanged water, followed by drying at 80° C. for five minutes and subsequent cooling, a non-tacky uniform coating film having a film thickness of 2 μm was produced.

The mask shown in FIG. 2 was intimately contacted with the coating film, and irradiated with UV rays of 500 mJ/cm$^2$, using a UV exposure device having a high-pressure mercury lamp, manufactured by ORC MANUFACTURING CO., LTD. under the trade name of JL-3300. The mask was then displaced transversely on the coating film to a position shown in FIG. 3 and irradiated with UV rays of 50 mJ/cm$^2$ as the mask was intimately contacted with the coating film. The mask was then displaced ion the coating film to a position shown in FIG. 4, and irradiated with UV rays of 100 mJ/cm$^2$, as the mask was intimately contacted with the coating film.

Then, after development with a 0.1 wt. % aqueous solution of lactic acid, only the cationic negative type photosensitive coating film :portions in register with the portions irradiated with the smallest irradiation amount, were selectively removed to:expose the ITO film. After washing with water and drying electroplating was carried out for 2.5 minutes at a current density of 0.1 A/cm$^2$ in a copper plating bath maintained at 45° C., using the master plate 3 as a cathode. After washing with water and drying, electrodeposition was carried out for three minutes by applying a d.c. voltage of 25 V at 25° C. across the master plate 3 as an anode and a stainless steel beaker containing a colored coating Y-8 as a cathode. After washing the master plate 3 with ion-exchanged water, the master plate 3 was obtained, in which a black-hued colored layer was formed on the copper plated layer portions freed of the coating film.

Then, after development with a 0.5 wt. % aqueous solution of lactic acid, no Changes were noticed in the black-hued colored layer 1, whilst only the negative type photosensitive coating film portions in register with the portions irradiated with the second smallest irradiation amount were selectively removed. After washing with water and drying, the colored coating Y-4 was electrodeposited for three minutes under conditions of a d.c. voltage of 25 V and a temperature of 25° C. similarly to electrodeposition of the colored coating Y-4. After Washing with ion-exchanged water, it was found that no change was noticed on the black-hued layer 1, and a red-hued colored layer 3 was formed on the master plate portions freed of the coating film. After drying at 80° C. for five minutes and development with a 3.0 wt. % of lactic acid, it was found that no changes were produced in the black-hued or red-hued colored layer and only the negative type photosensitive coating film portions in register with the portions irradiated with the third smallest irradiation amount were selectively removed. After washing with water and drying, the colored coating Y-5 was electrodeposited for three minutes under conditions of a d.c. voltage of 25 V and a temperature of 25° C. in the same manner as for electrodeposition of the colored coating Y-8. After washing the master plate 3 with ion-exchanged water, it was found that no changes were produced in the previously formed black-hued or red-hued colored layer and a green-hued colored layer 4 was formed in the master plate portions freed of the coating film.

Then, after drying at 80° C. for five minutes, and development with a 7.0 wt. % aqueous solution of lactic acid, no changes were noticed in the colored layers, and only the residual cationic negative type photosensitive coating film, that is the photosensitive coating film portions in register with the portions irradiated with the largest irradiation amount, were selectively removed. After electrodeposition for three mites at 25° C. with the d.c. voltage of 25 V, using the exposing surface as an anode and a stainless steel beaker containing the colored coating Y-6 as a cathode, washing the master plate 3 with ion-exchanged water and drying at 80° C. for five minutes, the master plate 3 in which a blue-hued colored layer 2 having a film thickness of 2 μm and not showing tackiness at ambient temperature was produced in the master plate portions freed of the coating film and which had the black-hued colored layer, the red-hued colored layer, the green-hued colored layer and the blue-hued colored layer, was produced. By baking at 170° C. for 30 minutes to complete the curing, a color filter having the light-intercepting layer, and the colored layers, each 1.9 μm in film thickness, showing excellent transparency and uniformity, could be obtained.

EXAMPLE 4

By electrodeposition for three minutes under conditions of a d.c. voltage of 25 V and a temperature of 25° C., with the use as an anode of a similar substrate as used in Example 1, hereinafter referred to as a master plate 4, and with the users a cathode of a stainless steel beaker containing an aqueous solution of an anionic negative type photosensitive coating (X-4), followed by washing of the master plate 4 with ion-exchanged water, drying at 80° C. for five minutes and cooling, a non-tacky uniform coating film with a film thickness of 1.8 μm was produced.

The mask shown in FIG. 2 was intimately contacted with the coating film and irradiated with UV rays of 600 mJ/cm$^2$, using a UV exposure device having a high-pressure mercury lamp, manufactured by ORC MANUFACTURING CO., LTD. under the trade name of JL-3300. The mask was then displaced transversely on the coating film to a position shown in FIG. 3, and irradiated with UV rays of 50 mJ/cm$^2$, as the mask was intimately contacted with the coating film. The mask was then displaced on the; coating film to a position shown in FIG. 4, and irradiated with UV rays of 100 mJ/cm$^1$, as the mask was intimately contacted with the coating film.

Then, after development with a 0.1 wt. % aqueous solution of sodium carbonate, only the anionic negative type photosensitive coating film portions in register with the portions irradiated with the smallest irradiation amount, were selectively removed to expose the ITO film. After washing with water and drying followed by electrodeposition at 25° C. for three minutes at a d.c. voltage of 30 V, with the use as a cathode of the master plate 4 and with the use as an anode of a stainless Steel beaker containing a colored coating Y-7, followed by washing the master plate 4 with ion-exchanged water and drying at 80° C. for five minutes, a black-hued colored layer 1 was formed on the master plate portions freed of the coating film.

Then, after development with a 0.75 wt. % aqueous solution of sodium carbonate no changes were notived in the black-hued colored layer, and only the negative type photosensitive coating film portions in register with the portions irradiated with the second smallest irradiation amount were selectively removed. After washing with water and drying, the colored coating Y-2 was electrodeposited for three minutes under the conditions of a d.c. voltage of 30 V and a temperature of 25° C. similarly to electrodeposition of the colored coating Y-7. After washing with ion-exchanged water, a green-hued colored layer 3 was formed on the portions freed of the coating film, while no change was noticed on the black-hued colored layer 1. After drying at 80° C. for five minutes and development with a 5.0 wt. % aqueous solution of sodium metasilicate, no changes were noticed in the black-hued or green-hued colored layer, and only the negative type photosensitive coating film portions in register with the portions irradiated with the third smallest irradiation amounts were selectively removed. After washing with water and drying, the colored coating Y-3 was electrodeposited for three minutes under conditions of a d.c. voltage of 30 V and the temperature of 25° C., in the same manner as for electrodeposition of the colored coating Y-7. After washing the master plate 4 with ion-exchanged water, it was found that no changes were produced in the previously formed black-hued or green-hued colored layers and a blue-hued colored layer 4 was formed in the portions freed of the coating film.

Then, after drying at 80° C. for five minutes and development with a 9.0 wt. % aqueous solution of sodium metasilicate, it was found that no changes were produced in the colored layers and the residual anionic negative type photosensitive coating, that is the photosensitive coating film portions in register with the portions irradiated with the largest irradiation amounts were selectively removed. After washing with water and drying, the colored coating Y-1 was electrodeposited for three minutes at 25° C. at a d.c. voltage of 30 V in the same manner as for electrodepositing the colored coating Y-7. After washing the master plate 4 with ion-exchanged water, the master plate 4 in which a red-hued colored layer 2 was formed in the portions freed of the coating film and which had the black-hued, green-hued and red-hued colored layers, was produced. After baking at 175° C. for 30 minutes to complete the curing, a color filter having the light-intercepting layer and the colored layers, each 1.9 μm in film thickness and having excellent transparency and uniformity was produced.

Although the present invention has been described with reference to the preferred examples, it should be understood that various modifications and variations can be easily made by those skilled in the art without departing from the spirit of the invention. Accordingly, the foregoing disclosure Should be interpreted as illustrative only and is not to be interpreted in a limiting sense. The present invention is limited only by the scope of the following claims.

What is claimed is:

1. A method for producing a color filter comprising the steps of:
    (A) forming a photosensitive coating film on a transparent electrically conductive layer of a transparent substrate having said transparent electrically conductive layer on its surface, and exposing said photosensitive coating film to light in a first irradiation amount through a mask having a predetermined pattern of a certain light transmittance, and at least once displacing said mask to another position on said photosensitive coating film and exposing said photosensitive coating film to light in a second irradiation amount different from said first irradiation amount through said mask; and (B) developing and removing a photosensitive coating film portion exposed to light in an irradiation amount selected from the group consisting of the smallest irradiation amount and the largest irradiation amount for exposing the transparent electrically conductive layer and electrodepositing a colored coating on the exposed electrically conductive layer for forming a colored layer thereon, the operation of developing and removing the photosensitive coating film and electrodepositing the colored coating being sequentially repeated for the respective irradiation amounts where said sequence of repetition is selected from the group consisting of increased irradiation amount and decreasing irradiation amount to form different colored layers, respectively.

2. The method as claimed in claim 1 further comprising a step of photocuring said colored layers after said step (B) is performed.

3. The method as claimed in claim 1 further comprising a step of curing said colored layers by heating at 100° to 250° C. for 5 minutes to one hour after said step (B) is performed.

4. The method as claimed in claim 1 wherein said colored coating is electrodeposited at an electrical voltage of 5 to 500 V d.c. for a time interval of 5 to 300 seconds and at a liquid temperature of 10° to 35° C.

5. The method as claimed in claim 1 wherein said photosensitive coating, film is formed by a method selected from the group consisting of electrodeposition, spraying, dip coating, roll coating, screen printing and spin coating.

6. The method as claimed in claim 1 wherein said photosensitive coating film is formed of a negative photosensitive coatings containing a negative photosensitive coating resin exhibiting coating film forming capability and photosensitivity, a photopolymerization initiator and a solvent selected from the group consisting of an organic solvent and water, and wherein said operation is repeated in sequence of increasing irradiation amounts.

7. The method as claimed in claim 6 wherein said negative photosensitive coating resin has a molecular weight ranging between 500 and 10,000.

8. The method as claimed in claim 6 wherein said negative photosensitive coating resin is a prepolymer selected from the group consisting of epoxy (meth)acrylate, urethane (meth)acrylate, polyester (meth)acrylate and mixtures thereof.

9. The method as claimed in claim 6 wherein said negative photosensitive coating resin is a specific group-containing cationic resin prepared by introducing the specific group and a photosensitive group into a main resin and neutralizing with an acidic material, said specific group being selected from the group consisting of an amino group, an ammonium group, a sulfonium group and mixtures thereof, said main resin being selected from the group consisting of acrylic resin, polyester resin, maleinated oil resin, epoxy resin, urethane resin, polybutadiene resin, polyamide resin and mixtures thereof, said photosensitive group being selected from the group consisting of an acryloyl group, a methacryloyl group, a cinnamoyl group and mixtures thereof, and said acidic material being selected from the group consisting of formic acid, acetic acid, propionic acid, lactic acid and mixtures thereof.

10. The method as claimed in claim 6 wherein said negative photosensitive coating resin is a carboxyl group-containing anionic resin obtained by introducing a carboxyl group and a photosensitive group into a main resin and neutralizing with a basic substance, said main resin being selected from the group consisting of acrylic resin, polyester resin, maleinated oil resin, polybutadiene resin, epoxy resin, urethane resin, polyamide resin and mixtures thereof, said photosensitive group being selected from the group consisting of an acryloyl group, a methacryloyl group, a cinnamoyl group and mixtures thereof, said basic substance being selected from the group consisting of triethylamine, diethylamine, dimethylethanol amine, ammonia and mixtures thereof.

11. The method as claimed in claim 6 wherein said photopolymerization initiator is selected from the group consisting of benzoins, benzoin ethers, benzilalkyl ketals, benzophenone, anthraquinone, thioxanthone, organic peroxides, trichloromethyl triazine, bisimidazole and mixtures thereof.

12. The method as claimed in claim 6 wherein an added amount of said photopolymerization initiator is 0.05 to 30 parts by weight to 100 parts by weight of said negative photosensitive coating resin.

13. The method as claimed in claim 6 wherein said organic solvent is selected from the group consisting of ethyleneglycol monobutyl ether, ethyleleglycol monohexyl ether, ethyleneglycol monophenyl ether, propyleneglycol monomethyl ether, propylneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethyl formamide, N,N-dimethyl acetoamide, dimethyl sulfoxide and mixtures thereof.

14. The method as claimed in claim 6 wherein said negative photosensitive coating contains colorant selected from the group consisting of dyes, pigments and mixtures thereof.

15. The method as claimed in claim 14 wherein said dye is selected from the group consisting of azo dyes, anthraquinone dyes, benzodifuranone dyes, condensed methine dyes and mixtures thereof.

16. The method as claimed in claim 14 wherein said pigment is selected from the group selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green emerald green titanium while, carbon black and mixtures thereof.

17. The method as claimed in claim 14 wherein said colorant is used in an amount of 3 to 70 wt. % based on a total amount of the negative photosensitive coating.

18. The method as claimed in claim 1 wherein said photosensitive coating film is formed of a positive photosensitive coating containing a positive photosensitive coating resin having coating film forming capability and photosensitivity and a solvent selected from the group consisting of an organic solvent and water, and wherein said operation is repeated in sequence, of decreasing irradiation amounts.

19. The method as claimed in claim 18 wherein said positive photosensitive coating resin is a quinone diazido group-containing cationic resin obtained by introducing a specific group and a hydroxyl group into a main resin, adding a quinone diazido sulfonic acid compound by esterification reaction and neutralizing with an acidic material, said specific group being selected from the group consisting of an amino group, an ammonium group, a sulfonium group and mixtures thereof, said main resin being selected from the group consisting of acrylic resin, polyester resin, maleinated oil resin, epoxy resin, urethane resin, polybutadiene resin, polyamide resin and mixtures thereof, and said acidic material being selected from the group consisting of formic acid, acetic acid, propionic acid, lactic acid and mixtures thereof.

20. The method as claimed in claim 18 wherein said positive photosensitive coating resin is a quinone diazido group-containing anionic resin obtained by introducing a carboxyl group and a hydroxyl group into a main resin, adding a quinone diazido sulfonic acid compound by esterification reaction and neutralizing with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

21. The method as claimed in claim 18 wherein said positive photosensitive coating resin is a quinone diazido group-containing resin obtained by reacting a resin having film forming capability and a hydroxyl group-containing compound with a quinone diazido compound, said quinone diazido compound being selected from the group consisting of a quinone diazido sulfonic acid derivative-containing quinone diazido compound and an isocyanate group-containing quinone diazido compound.

22. The method as claimed in claim 18 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethyl acetoamide, dimethyl sulfoxide and mixtures thereof.

23. The method as claimed in claim 18 wherein said positive photosensitive coating contains a colorant selected from the group consisting of dyes, pigments and mixtures thereof.

24. The method as claimed in claim 23 wherein said dye is selected from the group considering of azo dyes, anthraquinone dyes, benzodifuranone dyes, condensed methine dyes and mixtures thereof.

25. The method as claimed in claim 23 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and mixtures thereof.

26. The method as claimed in claim 23 wherein 3 to 70 wt. % of said colorant is contained based on total weight of said positive photosensitive coating.

27. The method as claimed in claim 1 wherein said mask has a light-transmitting portion and a non light-transmitting portion.

28. The method as claimed in claim 27 wherein said mask has such a width between said light-transmitting portion and said non light-transmitting portion adjacent to said light-transmitting portion that when said mask is displaced, said light-transmitting portion is not overlapped with said non light-transmitting portion.

29. The method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

30. The method as claimed in claim 29 wherein said acidic material is selected from the group consisting of formic acid, acetic acid, propionic acid, lactic acid, hydrochloric acid, phosphoric acid and mixtures thereof.

31. The method as claimed in claim 29 wherein said basic material is selected from the group consisting of sodium carbonate, sodium hydrogen carbonate, sodium metasilicate, tetraalkyl ammonium hydroxide, sodium hydroxide, potassium hydroxide and mixtures thereof.

32. The method as claimed in claim 1 wherein said photosensitive coating film is developed and removed under conditions of a temperature of 10° to 70° C. and a developing time of 2 to 600 seconds.

33. The method as claimed in claim 1 wherein said colored coating is obtained by neutralizing a film-forming component and a colorant component with a material selected from the group consisting of an acidic substance and a basic substance, said film forming component being selected from the group consisting of cationic resins, anionic resins and photocurable resins, said colorant component being selected from the group consisting of dyes, pigment and mixtures thereof, said acidic substance being selected from the group consisting of formic acid, acetic acid, propionic acid, lactic acid and mixtures thereof, and said basic substance being selected from the group consisting of triethylamine, diethylamine, diethylethanolamine, ammonia and mixtures thereof.

34. The method as claimed in claim 33 wherein said cationic resin is obtained by introducing a specific group into a main resin, said specific group being selected from the group consisting of an amino group, an ammonium group, a sulfonium group and mixtures thereof, and said main resin being selected from the group consisting of acrylic resin, polyester resin, maleinated oil resin, epoxy resin, urethane resin, polybutadiene resin, polyamide resin and mixtures thereof.

35. The method as claimed in claim 33 wherein said anionic resin is obtained by introducing a carboxy group into a main resin selected from the group consisting of acrylic resin, polyester resin, maleinated oil resin, polybutadiene resin, epoxy resin, urethane resin, polyamide resin and mixtures thereof.

36. The method as claimed in claim 33 wherein said photocurable resin contains a functional group selected from the group consisting of an acryloyl group, a methacryloyl group, a cinnamoyl group and mixtures thereof in a molecule thereof.

37. The method as claimed in claim 33 wherein said photocurable resin comprises a photopolymerization initoator selected from the group consisting of benzoins, benzoin ethers, benzilalkyl ketals, benzophenone, anthraquinone, thioxanthone, organic peroxides, trichloromethyl triazine, bisimidazole and mixtures thereof.

38. The method as claimed in claim 33 wherein said dye is selected from the group consisting of azo dyes, anthraquinone dyes, benzodifuranone dyes, condensed methine dyes and mixtures thereof.

39. The method as claimed in claim 33 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium while, carbon black and mixtures thereof.

40. The method as claimed in claim 1 further comprising a step (C) for selectively forming a metal layer on said exposed electrically conductive layer formed in at least one of operations in said step (B) of developing and removing said photosensitive coating film.

41. The method as claimed in claim 40 further comprising a step (D) for electrodepositing a colored coating on said metal layer formed in said step (C).

42. The method as claimed in claim 40 wherein a metal of said metal layer is selected from the group consisting of copper, nickel, silver, gold, an alloy thereof and mixtures thereof.

* * * * *

UNITED STATES PATENT AND TRADEMARK OFFICE
CERTIFICATE OF CORRECTION

PATENT NO.  : 5,372,902
DATED       : December 13, 1994
INVENTOR(S) : Yukio YAMASITA, Haruyoshi SATO, Toru NAKAMURA, Hitoshi YUASA and Yutaka OTSUKI It is certified that error appears in the above-indentified patent and that said Letters Patent is hereby corrected as shown below:

On the Title Page, under item [19] and item [75], change "Yamashita" to --Yamasita--.

Signed and Sealed this

Twenty-eight Day of February, 1995

Attest:

BRUCE LEHMAN

*Attesting Officer*    *Commissioner of Patents and Trademarks*